(12) United States Patent
Li et al.

(10) Patent No.: US 11,812,675 B2
(45) Date of Patent: Nov. 7, 2023

(54) FILAMENT CONFINEMENT IN RESISTIVE RANDOM ACCESS MEMORY

(71) Applicant: International Business Machines Corporation, Armonk, NY (US)

(72) Inventors: Juntao Li, Cohoes, NY (US); Kangguo Cheng, Schenectady, NY (US); Dexin Kong, Redmond, WA (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 17/481,180

(22) Filed: Sep. 21, 2021

(65) Prior Publication Data
US 2023/0089257 A1    Mar. 23, 2023

(51) Int. Cl.
*H10N 70/00* (2023.01)
*H10N 70/20* (2023.01)

(52) U.S. Cl.
CPC ........ *H10N 70/8418* (2023.02); *H10N 70/011* (2023.02); *H10N 70/24* (2023.02); *H10N 70/8833* (2023.02)

(58) Field of Classification Search
CPC .. H10N 70/8418; H10N 70/011; H10N 70/24; H10N 70/8833
See application file for complete search history.

(56) References Cited

U.S. PATENT DOCUMENTS

| | | | |
|---|---|---|---|
| 9,059,391 B2 | 6/2015 | Hou | |
| 9,570,678 B1 | 2/2017 | Jo | |
| 9,627,614 B2 | 4/2017 | Lu | |
| 9,634,250 B2 | 4/2017 | Greeley | |
| 10,115,894 B2 | 10/2018 | Kim | |
| 10,490,745 B2 | 11/2019 | Sun | |
| 2007/0034848 A1 | 2/2007 | Liu | |
| 2016/0104838 A1 | 4/2016 | Park | |
| 2021/0225936 A1 | 7/2021 | Wang | |

FOREIGN PATENT DOCUMENTS

| | | |
|---|---|---|
| WO | 2010136056 A1 | 12/2010 |
| WO | 2016204420 A1 | 12/2016 |

OTHER PUBLICATIONS

Niu et al., "Geometric conductive filament confinement by nanotips for resistive switching of HfO2-RRAM devices with high performance", Scientific Reports, May 16, 2016, 9 pages, <https://www.nature.com/articles/srep25757.pdf>.
International Searching Authority, "Notification of Transmittal of the International Search Report and the Written Opinion of the International Searching Authority, or the Declaration", International application No. PCT/EP2022/073694, International Filing Date Aug. 25, 2022, dated Jan. 30, 2023, 9 pages.

*Primary Examiner* — Marvin Payen
(74) *Attorney, Agent, or Firm* — Gavin Giraud

(57) ABSTRACT

Embodiments disclosed herein include an RRAM cell. The RRAM cell may include a first nanowire electrically connected to a first wordline electrode. The nanowire may include a first sharpened point distal from the first wordline electrode. The RRAM cell may also include a metal contact electrically connected to a bitline electrode and a high-κ dielectric layer directly between the nanowire and the metal contact.

20 Claims, 10 Drawing Sheets

FILAMENT CONFINEMENT IN RESISTIVE RANDOM ACCESS MEMORY

BACKGROUND

The present invention relates generally to the field of semiconductor device fabrication, and more particularly to fabricating a resistive random access memory with a confined filament.

Resistive random-access memory (RRAM) is an emerging non-volatile (NV) random-access memory (RAM). RRAM has potential applications for both classic memory applications and neuromorphic computing.

In an RRAM semiconductor device, a memristor element is sandwiched between two electrodes. Defects such as oxygen vacancies are intentionally introduced in the memristor film, which enable memory cells to be programmed to one of two states: a set state or a reset state. In the set state, the memory cell has a "low" resistance state. In the reset state, the memory cell has a "high" resistance state. The set state and reset state of the memory cell require different threshold voltages to switch the memory cell. The reset threshold voltage is the voltage drop across the memory cell in the reset state that must be overcome to melt the memory cell by ohmic heating. The set threshold voltage is the voltage drop across the memory cell in the set state that must be overcome to melt the memory cell by ohmic heating. The threshold voltage for the memory cell in the reset state is comparatively higher than the threshold voltage for the memory cell in the set state. Therefore, it is possible to apply a program voltage that melts the memory cell in the set state but not in the reset state. Normally when the initial state of the memory cell is the reset state, a reset overwrite occurs when writing to the reset state. Reset overwrite is the process when the initial reset state in the memory cell is melted, cooled, and reprogrammed back to the reset state.

SUMMARY

Aspects of an embodiment of the present invention include a resistive random access memory (RRAM) cell. The RRAM cell may include a first nanowire electrically connected to a first wordline electrode. The nanowire may include a first sharpened point distal from the first wordline electrode. The RRAM cell may also include a metal contact electrically connected to a bitline electrode and a high-κ dielectric layer directly between the nanowire and the metal contact.

Aspects of an embodiment of the present invention include methods of fabricating a resistive random access memory (RRAM) cell. The methods may include forming a vertical fin segment comprising a wire layer between a first sacrificial layer and a second sacrificial layer, recessing lateral ends of the first sacrificial layer and the second sacrificial layer to form recesses, forming an inner spacer in the recesses of the first sacrificial layer and the second sacrificial layer, removing the first sacrificial layer and the second sacrificial layer to expose the wire layer, etching the wire layer to form a first nanowire comprising a first sharpened point and a second nanowire comprising a second sharpened point, forming a high-κ dielectric layer over the first nanowire and the second nanowire, and forming a metal contact, wherein the high-κ dielectric layer is directly between the first nanowire and the metal contact, and directly between the second nanowire and the metal contact.

Aspects of an embodiment of the present invention include a method of fabricating a resistive random access memory (RRAM) cell, where the method includes forming a wire stack comprising a wire layer supported on a first lateral end by a first inner spacer and supported on a second lateral end by a second inner spacer. The wire layer may be exposed in a region between the first inner spacer and the second inner spacer. The methods may also include isotropically etching the wire layer in the region to form a first nanowire and a second nanowire. The etching may be non-reactive to the first inner spacer and the second inner spacer.

DETAILED DESCRIPTION

Figure 1:
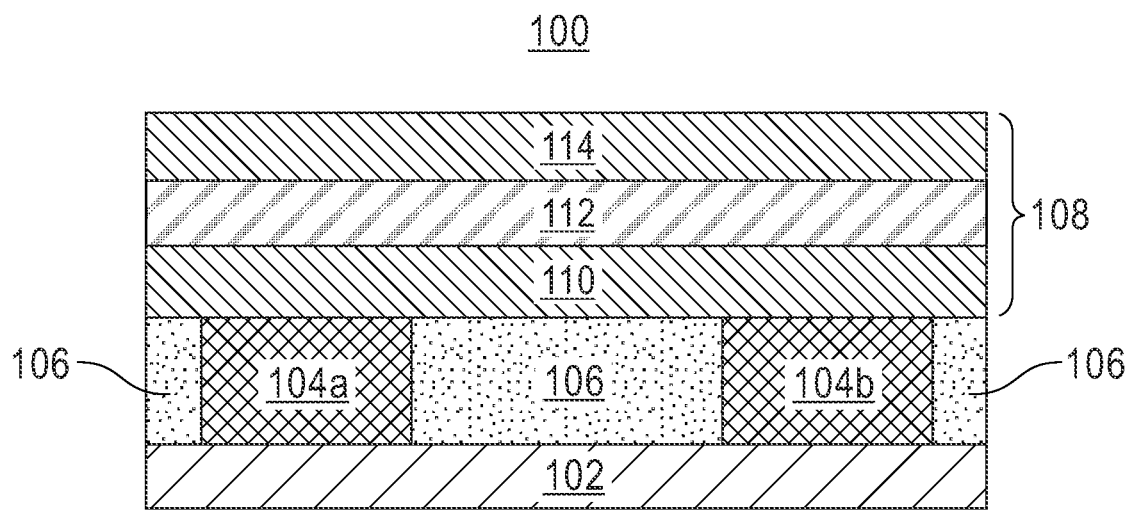
FIG. 1 depicts a cross-sectional side view of an RRAM cell at a stage of the fabrication process, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element.

The term "direct contact" or "directly between" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

Resistive random access memory (RRAM) semiconductor devices work using filament formation in a medium. Filament formation, however, is often a random process, especially along the edges of the RRAM semiconductor device. These edge effects become more pronounced in smaller RRAM semiconductor devices, and certain formation processes such as reactive ion etch can damage RRAM pillar sidewalls as the cell density for the individual devices scales up. Since demand for faster and more efficient circuits continues to increase, however, the RRAM cell density needs to be improved in the available area inside the chip. The density of RRAM arrays may be increased by improving the capability of controlling the location of filamentation during the formation process. Therefore, this invention provides a structure of, and a method for forming, RRAM cells with a nanowire that has a sharpened point that enables increased density due to a more confined filament formation, and a more direct signal flow through the RRAM cell.

Turning now to the figures, FIG. 1 depicts a cross-sectional side view of an RRAM cell 100 at a stage of the fabrication process, in accordance with one embodiment of the present invention. The RRAM cell 100 has a substrate 102 that may include unillustrated semiconductor devices such as transistors for logic operations, isolations structures, or contacts. The substrate 102 may also include just a monocrystalline silicon layer as is commonly used in semiconductor fabrication. In certain embodiments, the semiconductor substrate includes a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or another like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer.

Above the substrate 102, the RRAM cell 100 may include an electrode layer having a first wordline 104a and a second wordline 104b. The wordlines 104a, 104b may be arranged as rows for multiple RRAM cells as a large array fabricated on the substrate 102. Between the wordlines 104a, 104b, the RRAM cell 100 includes interlayer dielectric material (ILD) 106 that insulates the wordlines 104a, 104b from each other and from other wordlines. The ILD 106 may be a non-crystalline solid material such as silicon dioxide ($SiO_2$), undoped silicate glass (USG), fluorosilicate glass (FSG), borophosphosilicate glass (BPSG), a spin-on low-κ dielectric layer, a chemical vapor deposition (CVD) low-κ dielectric layer, or any combination thereof. The term "low-κ" as used throughout the present application denotes a dielectric material that has a dielectric constant of less than silicon dioxide.

Above the wordlines 104a, 104b, the RRAM cell 100 includes a stack 108 that includes a first sacrificial layer 110, a wire layer 112, and a second sacrificial layer 114. The sacrificial layers 110, 114 may include silicon oxide or another oxide that is etch selective from the ILD 106 and the wire layer 112. The wire layer 112 may include, but are not limited to, titanium-based materials (e.g., titanium nitride materials (e.g., TiN)), tantalum-based materials (e.g., tantalum nitride materials (e.g., TaN)), and tungsten-based materials (e.g., that are etch selective from the sacrificial layers 110, 114. Etch selective, in the context of this description, means that between two materials there exists an etch process (e.g., chemical wet etch) that can etch one of the materials without etching or otherwise degrading the other materials.

Figure 2:
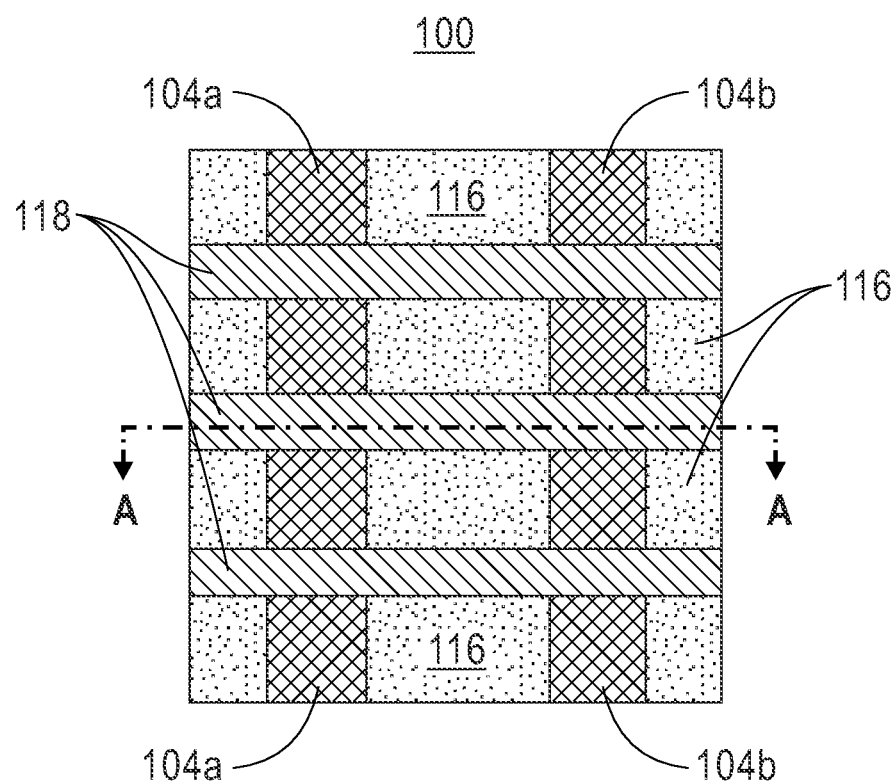
FIG. 2 depicts a top-down view of the RRAM cell of FIG. 1, with like reference numerals referring to like features and at a subsequent stage of the fabrication process.

FIG. 2 depicts a top-down view of the RRAM cell 100 of FIG. 1, with like reference numerals referring to like features and at a subsequent stage of the fabrication process. The stack 108 is etched to create isolating trenches 116 and vertical fins 118 of the stack materials (i.e., the first sacrificial layer 110, the wire layer 112, and the second sacrificial layer 114). FIG. 2 also indicates, at line A-A, the cross-sectional view of the RRAM cell 100 in FIG. 1 and subsequent figures. In embodiments of the present invention, each isolating trench 116 may be formed by an etching process or a selective etching process that selectively removes the stack 108 from within the isolating trenches 116. In some embodiments, this etching can be performed using an anisotropic etch such as reactive ion etching (RIE). Masking material (not shown) may be applied to the top of the stack 108 prior to etching each isolating trench 116, which resists etching and can be utilized to form the desired shape of the isolating trench 116, such as, for example, the shape depicted in FIG. 2. In some embodiments, the masking material may be a photoresist which has been patterned using photolithography.

Figure 3:
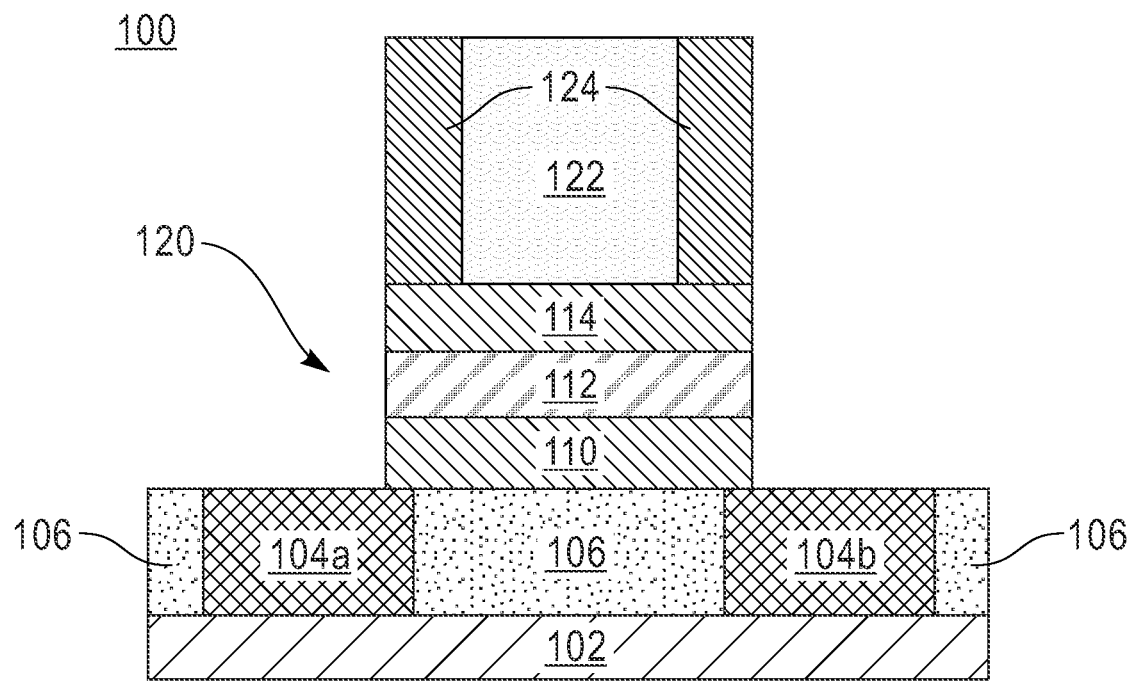
FIG. 3 depicts a cross-sectional side view of the RRAM cell of FIG. 1, with like reference numerals of previous figures referring to like features and at a subsequent stage of the fabrication process.

FIG. 3 depicts a cross-sectional side view of the RRAM cell 100 of FIG. 1, with like reference numerals of previous figures referring to like features and at a subsequent stage of the fabrication process. The vertical fins 118 are further etched to form vertical fin segments 120 with the same three layers: the first sacrificial layer 110, the wire layer 112, and the second sacrificial layer 114. Above the vertical fin segment 120, the RRAM cell 100 may include a mandrel 122 and spacers 124. The spacers 124 may be formed on opposing sides of the mandrel 122, over the vertical fin segment 120. The mandrel 122 may include, but not necessarily limited to, amorphous silicon (a-Si), amorphous carbon, polycrystalline silicon, polycrystalline silicon germanium, amorphous silicon germanium, polycrystalline germanium, and/or amorphous germanium. The spacers 124 may include materials that are etch selective to the rest of the RRAM cell 100. In particular, the spacers 124 may include at least one material, but is not limited to, insulator materials such as silicon nitride (SixNy), silicon oxynitride (SiON), and/or silicon carbonide nitride (SiCN), and/or oxide materials such as silicon oxide (SiOx).

The mandrel 122 and spacers 124 may be formed by known deposition and etching techniques. For example, the mandrel 122 may be formed using a deposition (e.g., chemical vapor deposition (CVD), plasma enhanced chemical vapor deposition (PECVD), evaporation or spin-on coating) followed by masking (e.g., photolithography) and etching as described above in relation to the formation of the isolation trenches 116. The spacers 124 may be formed using an etch back technique wherein the material of the spacers 124 is applied as a blanket layer, and then a directional etch removes the more horizontal portions above the mandrel 122, wordlines 104a, 104b, and the ILD 106, while the more vertical portions on the lateral sides of the mandrel 122 are left as illustrated in FIG. 3.

Figure 4:
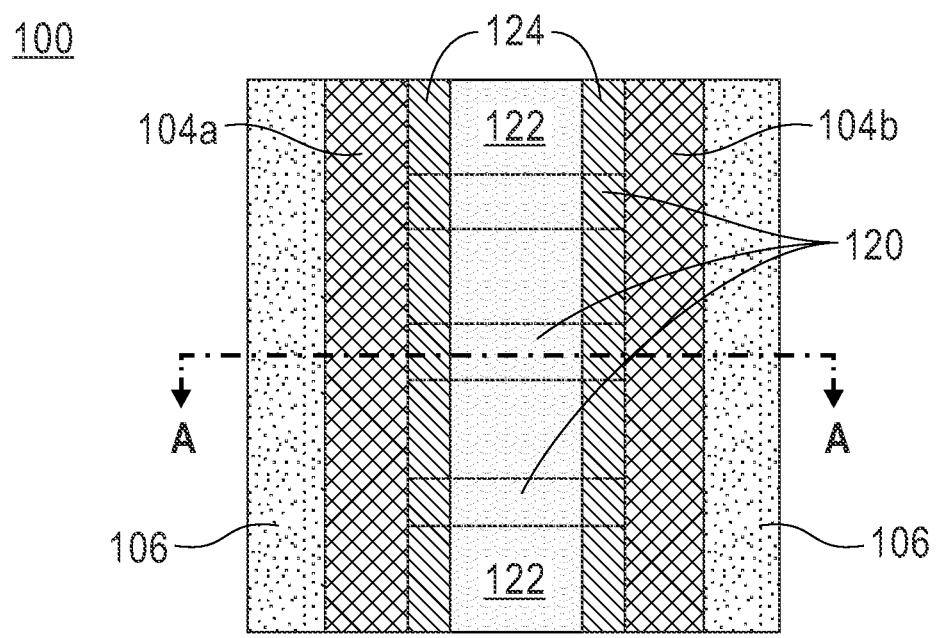
FIG. 4 depicts a top-down view of the RRAM cell of FIG. 1, with like reference numerals referring to like features and at a subsequent stage of the fabrication process.

FIG. 4 depicts a top-down view of the RRAM cell 100 of FIG. 1, with like reference numerals referring to like features and at the stage of the fabrication process illustrated in FIG. 3. FIG. 4 shows that the mandrel 122 and the spacers 124 form lengthwise with the wordlines 104a, 104b such that the space between the vertical fin segments 120 is filled in with the material of the mandrel 122 and the spacers 124.

Figure 5:
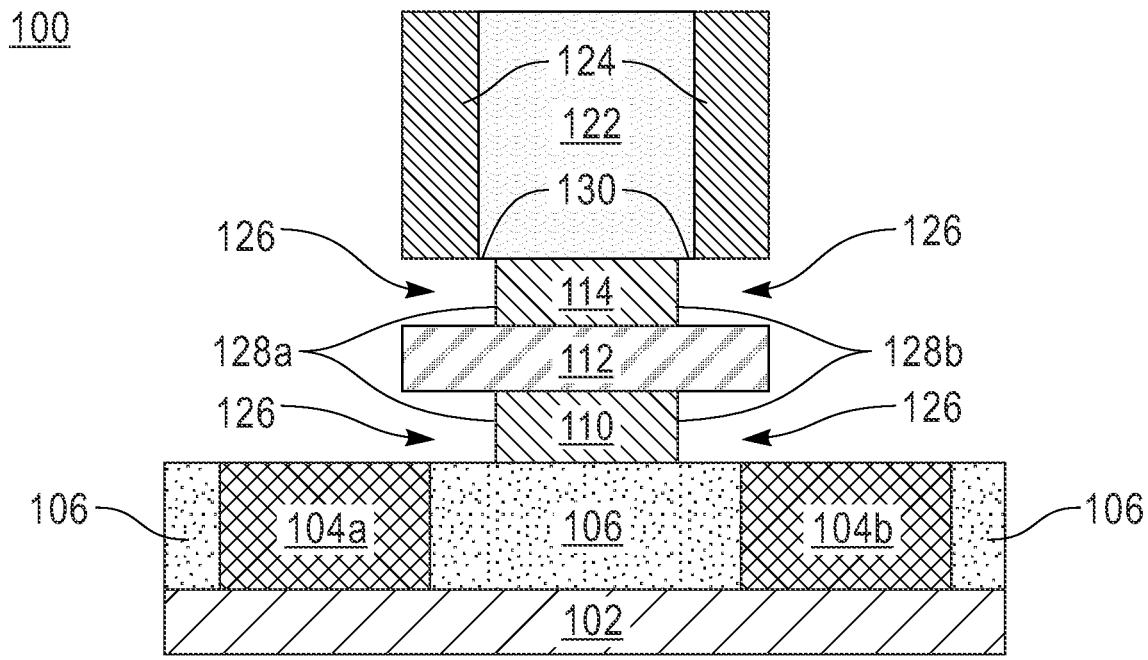
FIG. 5 depicts a cross-sectional side view of the RRAM cell of FIG. 1, with like reference numerals of previous figures referring to like features and at a subsequent stage of the fabrication process.

FIG. 5 depicts a cross-sectional side view of the RRAM cell 100 of FIG. 1, with like reference numerals of previous figures referring to like features and at a subsequent stage of the fabrication process. The first sacrificial layer 110 and the second sacrificial layer 114 are etched back using an etch process that is etch selective only to the sacrificial layers 110, 114. The etch back exposes recesses 126 from a first lateral end 128a and a second lateral end 128b. The etch process may etch enough of the sacrificial layers 110, 114 that the recesses 126 expose the mandrel 122 at an exposure point 130.

Figure 6:
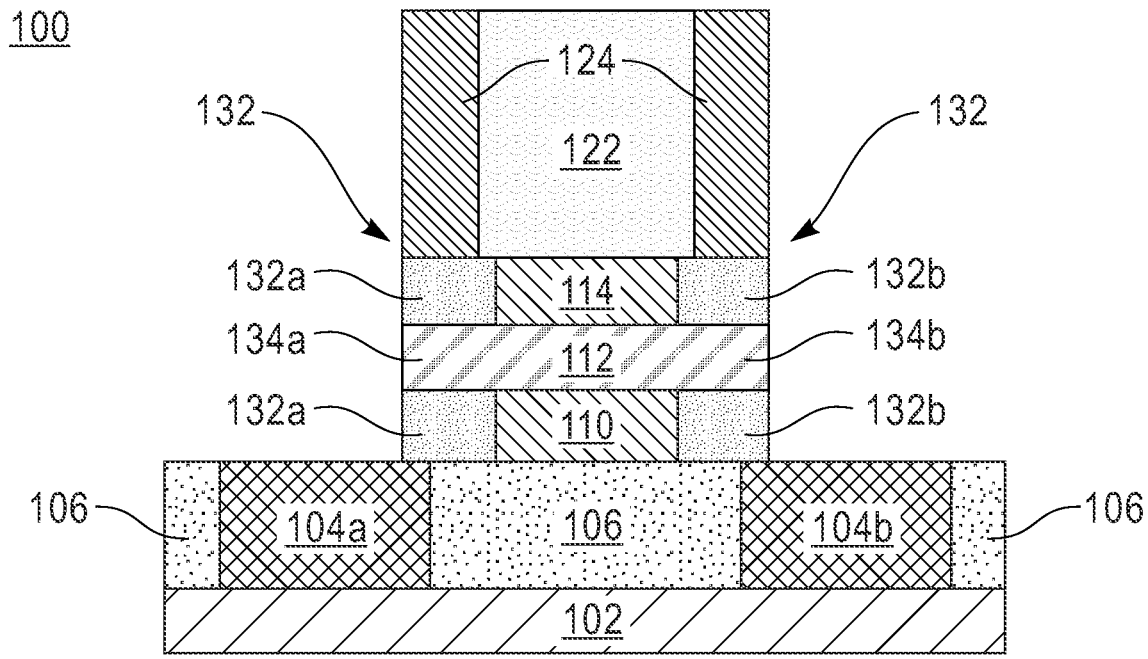
FIG. 6 depicts a cross-sectional side view of the RRAM cell of FIG. 1, with like reference numerals of previous figures referring to like features and at a subsequent stage of the fabrication process.

FIG. 6 depicts a cross-sectional side view of the RRAM cell 100 of FIG. 1, with like reference numerals of previous figures referring to like features and at a subsequent stage of the fabrication process. The recesses 126 are filled with inner spacers 132 such that the wire layer 112 is supported on a first lateral end 134a by a first inner spacer 132a and supported on a second lateral end 134b by a second inner spacer 132b.

Figure 7:
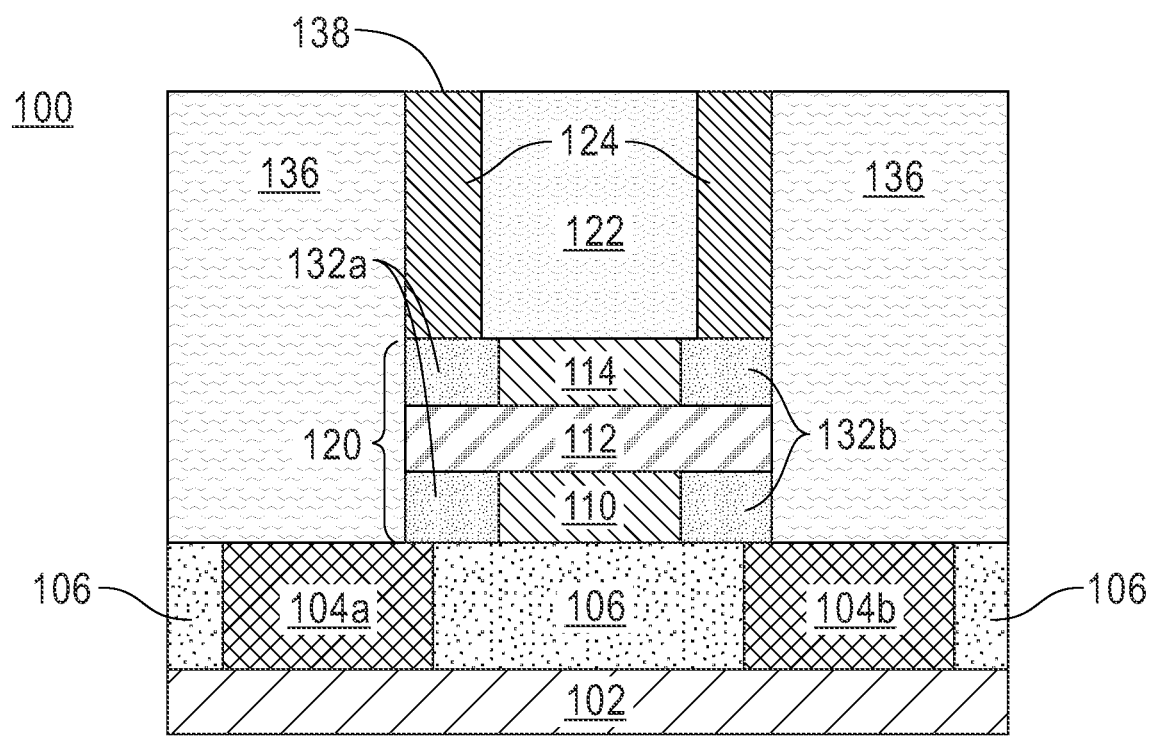
FIG. 7 depicts a cross-sectional side view of the RRAM cell of FIG. 1, with like reference numerals of previous figures referring to like features and at a subsequent stage of the fabrication process.

FIG. 7 depicts a cross-sectional side view of the RRAM cell 100 of FIG. 1, with like reference numerals of previous figures referring to like features and at a subsequent stage of the fabrication process. The RRAM cell 100 includes further deposited ILD material 136 on opposing sides of the vertical fin segments 120 with the mandrel 122 and spacers 124. The ILD 136, the mandrel 122, and the spacers 124 may be planarized so that the RRAM cell 100 is uniformly flat at a top surface 138.

Figure 8:
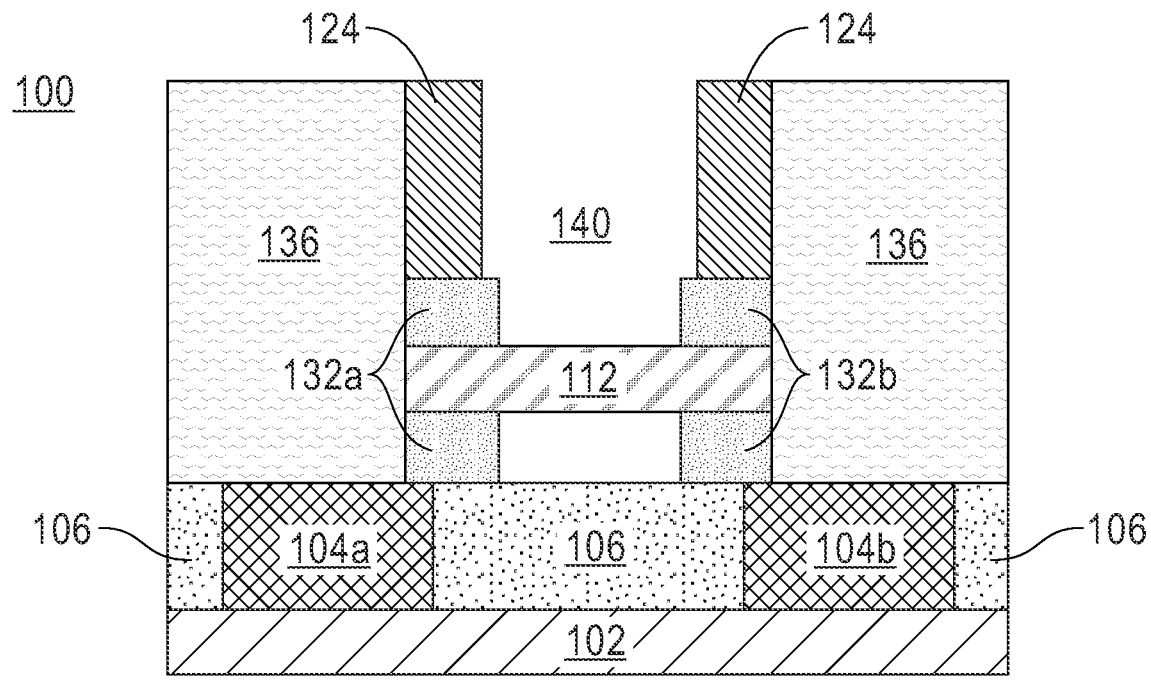
FIG. 8 depicts a cross-sectional side view of the RRAM cell of FIG. 1, with like reference numerals of previous figures referring to like features and at a subsequent stage of the fabrication process.

FIG. 8 depicts a cross-sectional side view of the RRAM cell 100 of FIG. 1, with like reference numerals of previous figures referring to like features and at a subsequent stage of the fabrication process. The mandrel 122, the first sacrificial layer 110, and the second sacrificial layer 114 are selectively etched so that the spacers 124, the inner spacers 132a, 132b, the wire layer 112, and the ILD 136 are not etch, degraded, or otherwise affected. The wire layer 112 is thus exposed in a region 140 between the first inner spacer 132a and the second inner spacer 132b. The region 140 exposes the wire layer 112 above and below, as shown in FIG. 8, but also around the wire layer 112 so that a center portion of the wire layer 112 may contact fluids within the region 140.

Figure 9:
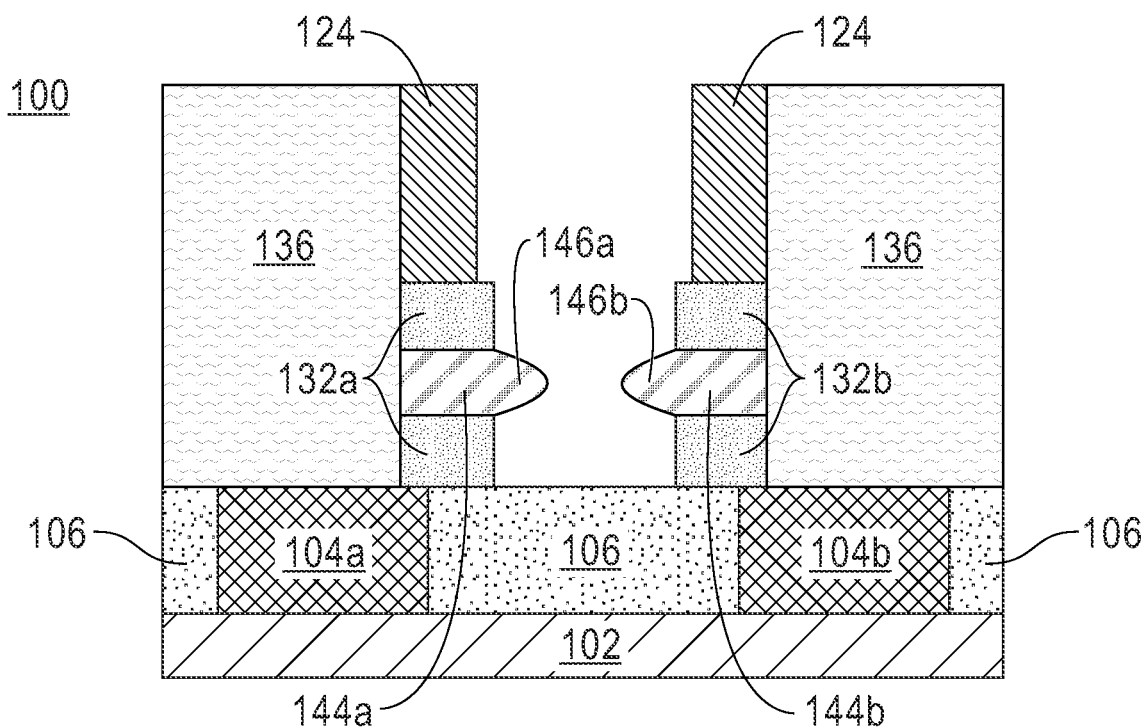
FIG. 9 depicts a cross-sectional side view of the RRAM cell of FIG. 1, with like reference numerals of previous figures referring to like features and at a subsequent stage of the fabrication process.

FIG. 9 depicts a cross-sectional side view of the RRAM cell 100 of FIG. 1, with like reference numerals of previous figures referring to like features and at a subsequent stage of the fabrication process. The wire layer 112 may be etched into two segments with a sharpened shape opposite each other using, e.g., an isotropic etch process. The term "isotropic etch" denotes an etch process that is non-directional. By "non-directional" it is meant that the etch rate is not substantially greater in any one direction in comparison to all of the etch directions. The isotropic etch may be a wet chemical etch or a dry etch. For example, the etchant may be a corrosive liquid or a chemically active ionized gas, such as a plasma. The wire layer 112 is etched to form a first nanowire 144a having a first sharpened point 146a and a second nanowire 144b having a second sharpened point 146b. The wire layer 112 may be etched using an isotropic etch such that parts of the wire layer 112 that are in the middle of the region 140 are more quickly etched than the parts of the wire layer 112 that are closer to the inner spacers 132a, 132b. The quicker etch further from the inner spacers 132a, 132b means that the wire layer 112 is etched away completely in the center before the remaining nanowires 144a, 144b are etched much at all. Thus, the first sharpened point 146a protrudes into a first side of the metal contact 150, and the second sharpened point 146b protrudes into a second side of the metal contact 150 opposite the first side.

Figure 10:
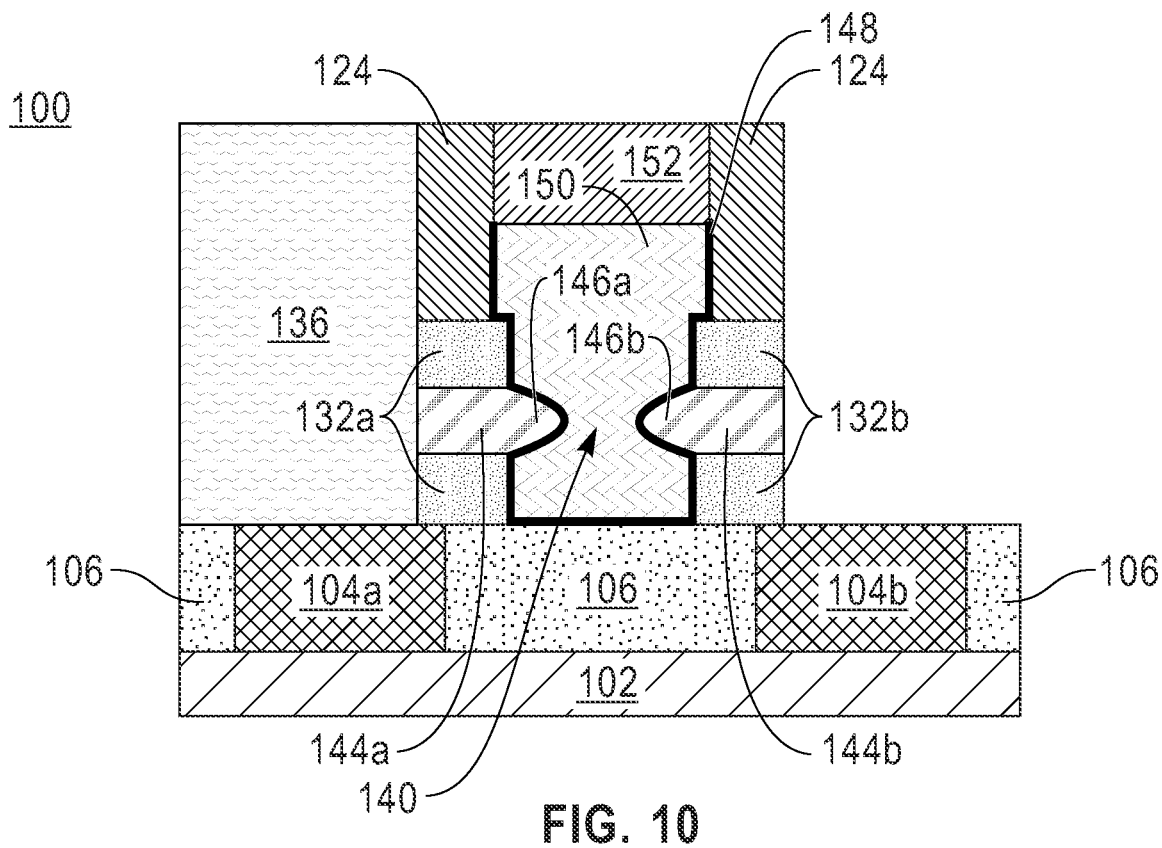
FIG. 10 depicts a cross-sectional side view of the RRAM cell of FIG. 1, with like reference numerals of previous figures referring to like features and at a subsequent stage of the fabrication process.

FIG. 10 depicts a cross-sectional side view of the RRAM cell 100 of FIG. 1, with like reference numerals of previous figures referring to like features and at a subsequent stage of the fabrication process. Within the region 140 (that is now between the first nanowire 144a and the second nanowire 144b), the RRAM cell 100 includes a high-κ dielectric layer 148 and a metal contact 150. The high-κ dielectric layer 148 may be directly between the first nanowire 144a and the metal contact 150, and directly between the second nanowire 144b and the metal contact 150. Thus, the first sharpened point 146a protrudes into a first side of the metal contact 150, and the second sharpened point 146a protrudes into a second side of the metal contact 150 opposite the first side. The high-κ dielectric layer 148 may include hafnium oxide. In some embodiments, the high-κ dielectric layer 148 is a transitional metal oxide. Examples of materials that can be suitable for RRAM dielectric include $NiO_X$, $Ta_yO_X$, $TiO_X$, $Ta_yO_X$, $WO_X$, $ZrO_X$, $Al_yO_X$, $SrTiO_X$, and the metal contact 150 may include any metal or other conductive material. The metal contact may include a stack structure (not shown) of metal nitride (for example, titanium nitride, tantalum nitride, or tungsten nitride), Al-containing alloy (for example, TiAl, TiAlC, TaAl, TaAlC), titanium, tantalum, or a combination including at least one of the foregoing. Specifically, the metal contact can include a stack structure of titanium nitride and TiAlC. The high-κ dielectric layer 148 may be formed by blanket deposition followed by deposition of the metal contact 150. Then, both can be etched back to make room in the region 140 for a dielectric cap 152 above the metal contact 150.

Figure 11:
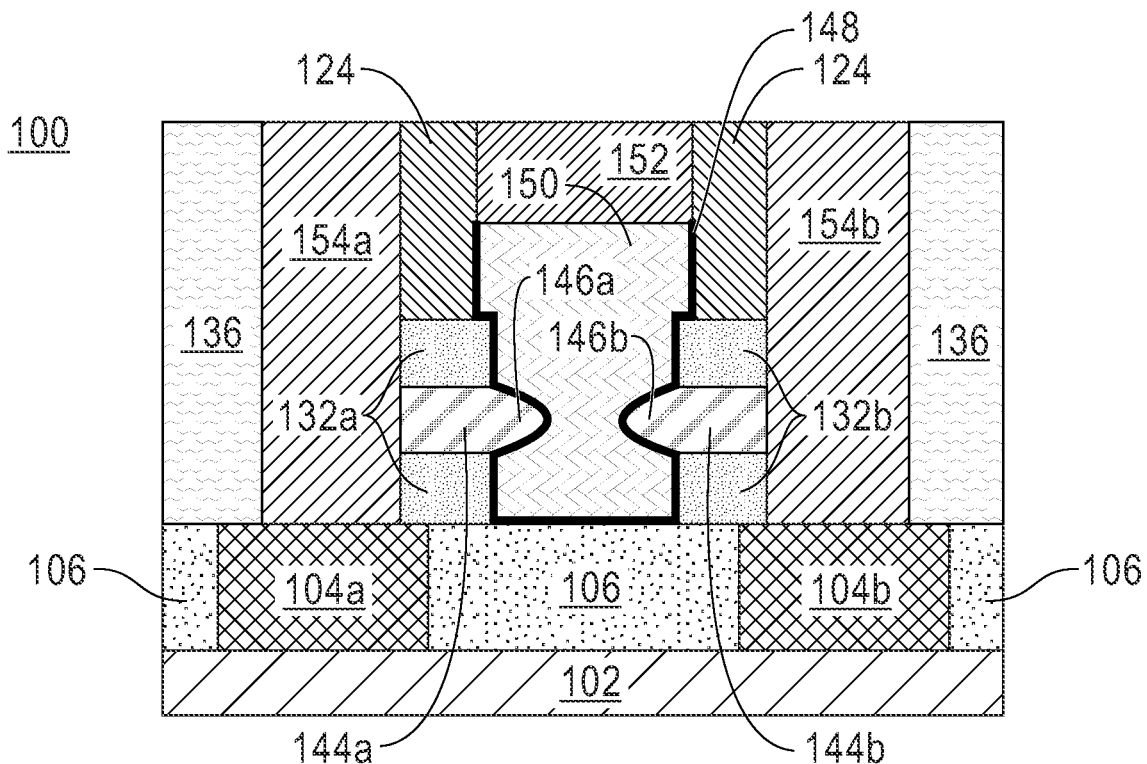

FIG. 11 depicts a cross-sectional side view of the RRAM cell 100 of FIG. 1, with like reference numerals of previous figures referring to like features and at a subsequent stage of the fabrication process. The RRAM cell 100 may include a first sidewall metal contact 154a that electrically connects the first wordline 104a to the first nanowire 144a, and a second sidewall metal contact 154b that electrically connects the second wordline 104b to the second nanowire 144b. The sidewall metal contacts 154a, 154b electrically connect the wordlines 104a, 104b to the nanowires 144a, 144b such that the sharpened points 146a, 146b are distal from the wordlines 104a, 104b. The sidewall metal contacts 154a, 154b typically include tungsten, but may also include other metals. The sidewall metal contacts 154a, 154b may be formed using a self-aligning etch process: utilizing an chemical wash or directed etch that is etch selective to the ILD 136, but is not etch selective to the spacers 124, inner spacers 132a, 132b, or the nanowires 144a, 144b. With this process, the sidewall metal contacts 154a, 154b directly contact the wordlines 104a, 104b and the nanowires 144a, 144b, enabling an electrical connection unmitigated by material from the ILD 136.

Figure 12:
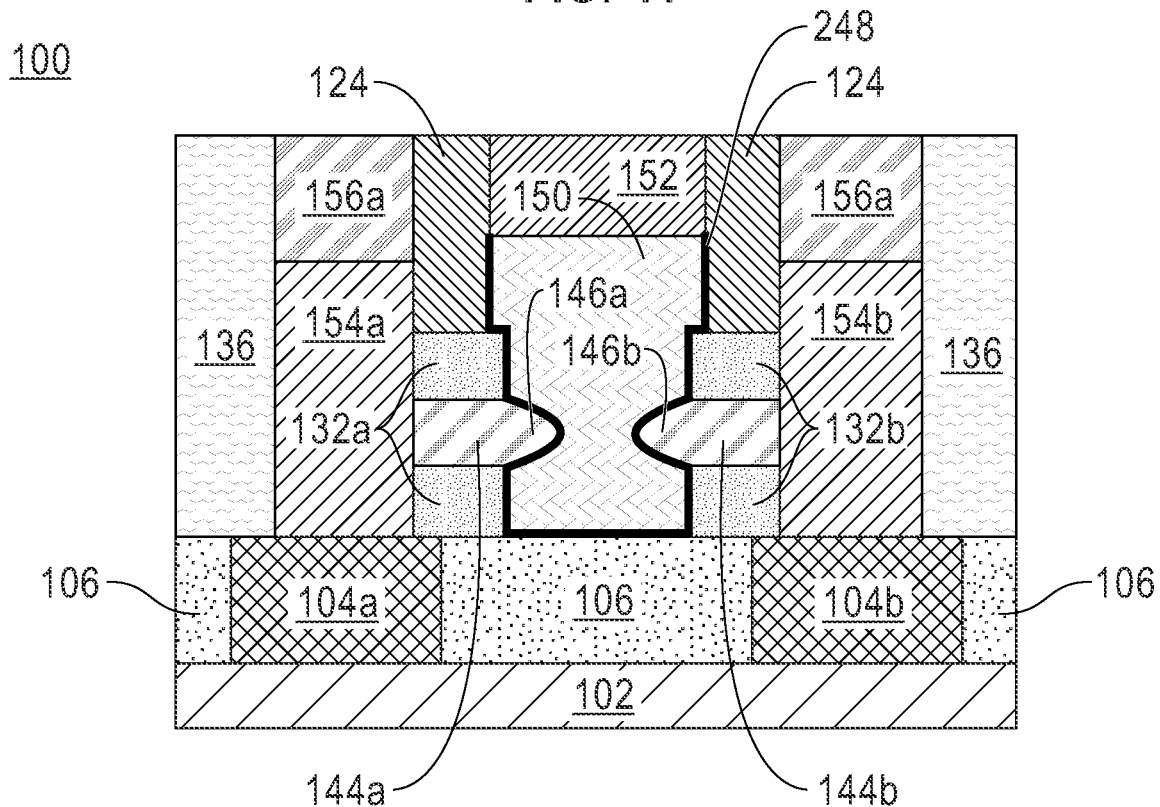
FIG. 12 depicts a cross-sectional side view of the RRAM cell of FIG. 1, with like reference numerals of previous figures referring to like features and at a subsequent stage of the fabrication process.

FIG. 12 depicts a cross-sectional side view of the RRAM cell 100 of FIG. 1, with like reference numerals of previous figures referring to like features and at a subsequent stage of the fabrication process. The RRAM cell 100 may include sidewall dielectric caps 156a, 156b above the sidewall metal contacts 154a, 154b. The sidewall dielectric caps 156a, 156b may be fabricated with the same dielectric material as the dielectric cap 152, or may be fabricated with different materials with etch selectivity.

Figure 13:
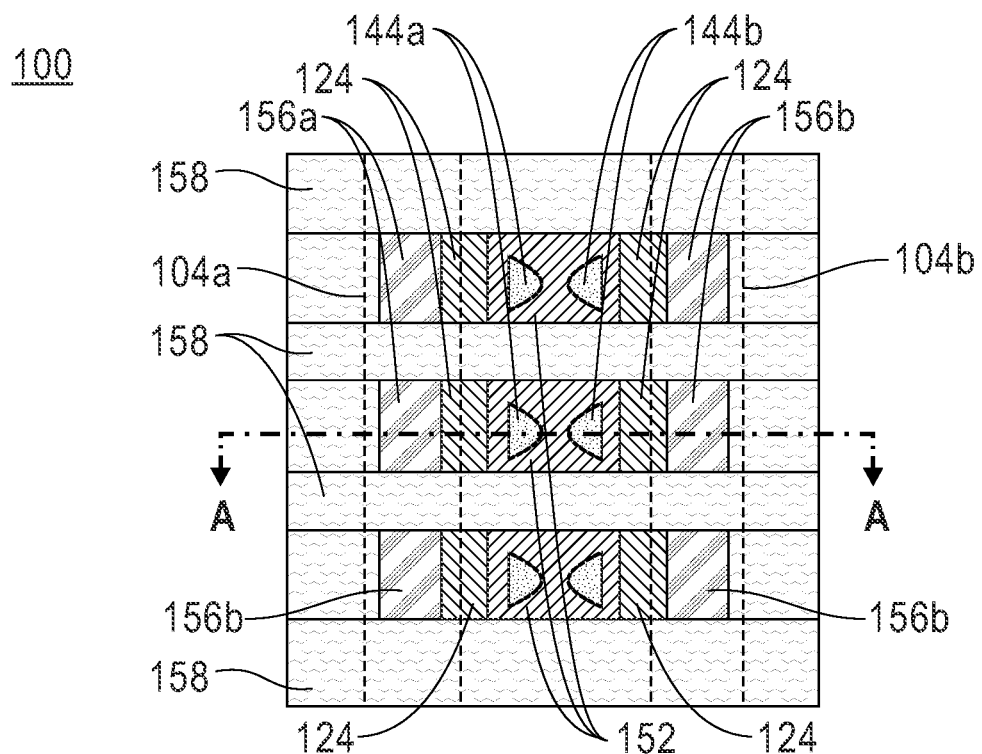
FIG. 13 depicts a cross-sectional side view of the RRAM cell of FIG. 1, with like reference numerals of previous figures referring to like features and at a subsequent stage of the fabrication process.

FIG. 13 depicts a top-down see-through view of the RRAM cell 100 of FIG. 1, with like reference numerals referring to like features and at a subsequent stage of the fabrication process. While unillustrated in FIG. 13, the metal contact 150, the high-κ dielectric layer 148, along with the illustrated spacers 124, the dielectric cap 152, and the sidewall dielectric caps 156a, 156b are fabricated initially as strips running parallel and above the wordlines 104a, 104b. FIG. 13 shows a fabrication stage at which the spacers 124, the metal contact 150, the high-κ dielectric layer 148, the dielectric cap 152, and sidewall dielectric caps 156a, 156b are etched to separate pairs of nanowires 144a, 144b. Specifically, FIG. 13 shows separating structures 158 that enable each nanowire 144 to be electrically insulated laterally from all other nanowires 144. The separating structures 158 may be formed of the same material as the ILD 136, but may also include different material, or material deposited at a different time. The first nanowires 144a are electrically connected to the first wordline 104a, but the separating structures 158 make sure that the nanowires do not short directly to one another through the metal contact 150.

Figure 14:
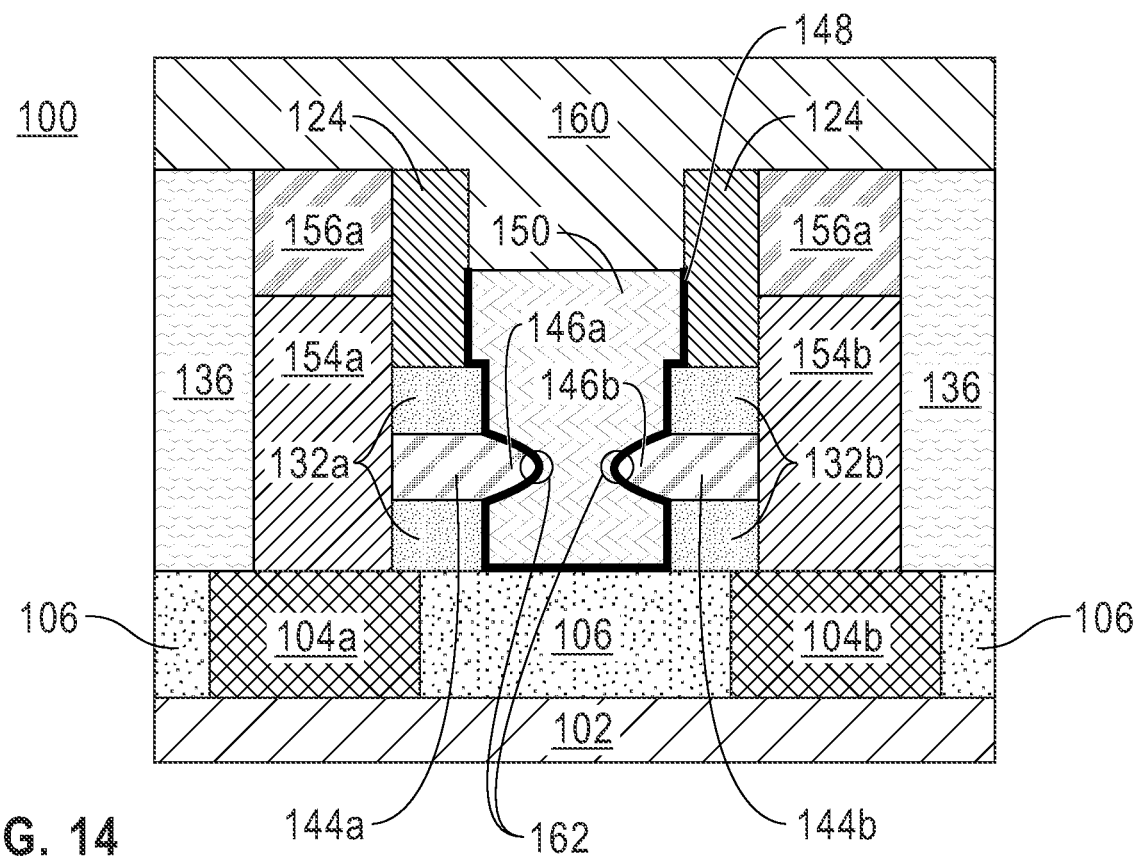
FIG. 14 depicts a cross-sectional side view of the RRAM cell of FIG. 1, with like reference numerals of previous figures referring to like features and at a subsequent stage of the fabrication process.

FIG. 14 depicts a cross-sectional side view of the RRAM cell 100 of FIG. 1, with like reference numerals of previous figures referring to like features and at a subsequent stage of the fabrication process. The RRAM cell 100 includes a bitline 160 that replaces the dielectric cap 152 and runs perpendicularly to the wordlines 104 to form an array. That is, the wordlines 104 are the rows of the RRAM circuit while bitlines 160 are the columns of the RRAM circuit.

Operation of the RRAM cell 100 involves signals to the wordlines 104 and the bitlines 160. When a set signal is sent to the appropriate combination of first wordline 104a and bitline 160, then the first nanowire 144a is set. Setting of an RRAM cell involves creating filaments 162, but in the case of the first nanowire 144a, the filament creation is confined to the first sharpened point 146a. That is, the sharpened point 146a provides a ready path for the set signal to pass between the first wordline 104a and the bitline 160, where a filament is created. Additionally, the first sharpened point 146a also provides a ready path for the read signals after the filaments have been created. Similar operation is enabled for the second nanowire 144b for set and read signals between the bitline 160 and the second wordline 104b. FIG. 13 shows six such nanowires in an array (i.e., three nanowires 144a for the first wordline 104a and three nanowires 144b for the second wordline 104*b*) but it is known in the art that thousands or millions of RRAM cells 100 may be fabricated in such an array.

Figure 15:
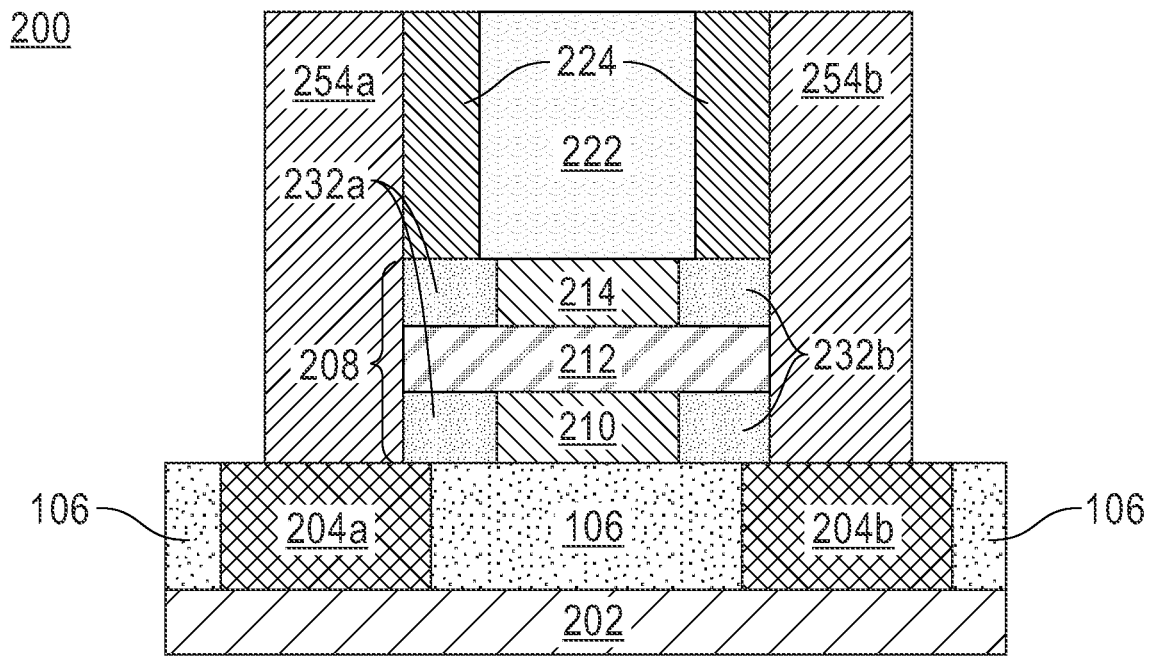
FIG. 15 depicts a cross-sectional side view of an RRAM cell at a stage of the fabrication process, in accordance with one embodiment of the present invention.

FIG. 15 depicts a cross-sectional side view of an embodiment of an RRAM cell 200, at a fabrication stage of the processing method. The RRAM cell 200 of FIG. 15 may be formed in a manner similar to FIGS. 1-6, with a substrate 202, wordlines 204*a*, 204*b*, a stack 208, inner spacers 232*a*, 232*b*, a mandrel 222, and spacers 224 all formed in a manner described in the first embodiment. In the embodiment described henceforth, however, sidewall metal contacts 254*a*, 254*b* are formed before the mandrel 222 is etched, and before formation of ILD 236. The sidewall metal contacts 254 may be formed by blanket deposition followed by directed etch back that removes the more horizontal portions above the mandrel 222. This leaves metal material along the more vertical portions, as illustrated.

Figure 16:
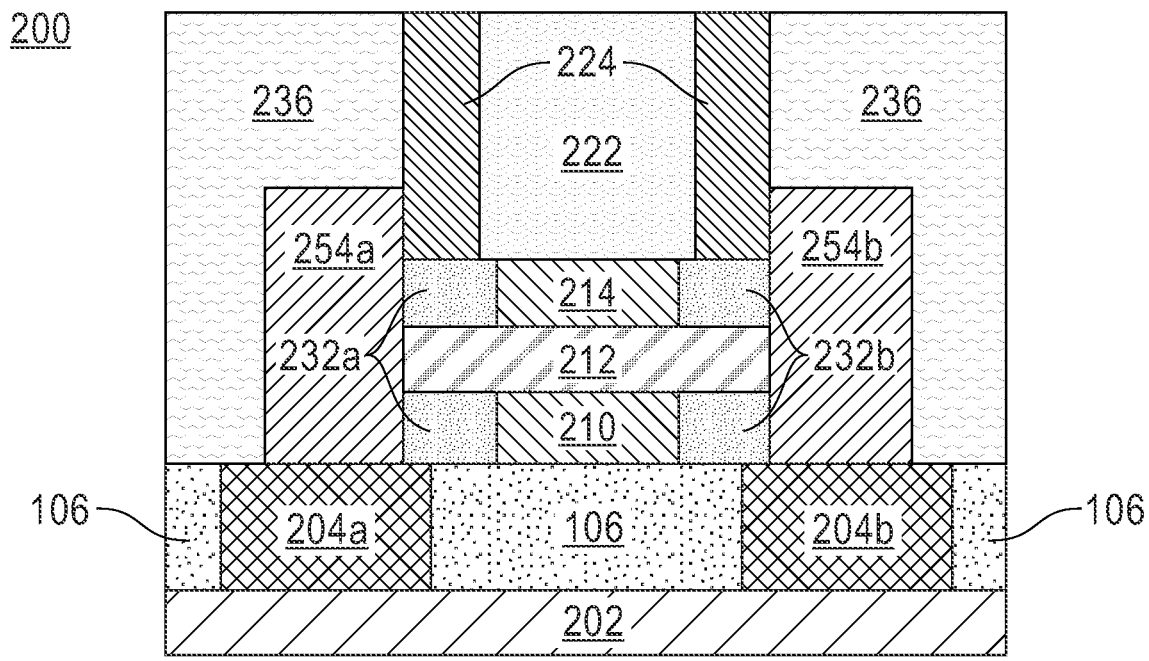
FIG. 16 depicts a cross-sectional side view of an embodiment of the RRAM cell of FIG. 15, at a fabrication stage of the processing method.

FIG. 16 depicts a cross-sectional side view of the RRAM cell 200 of FIG. 15, with like reference numerals of previous figures referring to like features and at a subsequent stage of the fabrication process. The sidewall metal contacts 254*a*, 254*b* are recessed further, and ILD material 236 is added, after which the RRAM cell 200 may undergo chemical-mechanical planarization (CMP) so that the ILD 236, the mandrel 222, and the spacers 224 are all level. The ILD 236 may be formed in different ways. For example, the sidewall metal contacts 254 may be recessed before any ILD 236 material is deposited. On the other hand, the ILD 236 may be deposited beside the sidewall metal contacts 254 followed by etch back of the ILD 236 and sidewall metal contacts 254 and a second layer of ILD 236. The ILD 236, in the illustrated embodiment, takes the place of the sidewall dielectric caps 156 in the embodiment described above.

Figure 17:
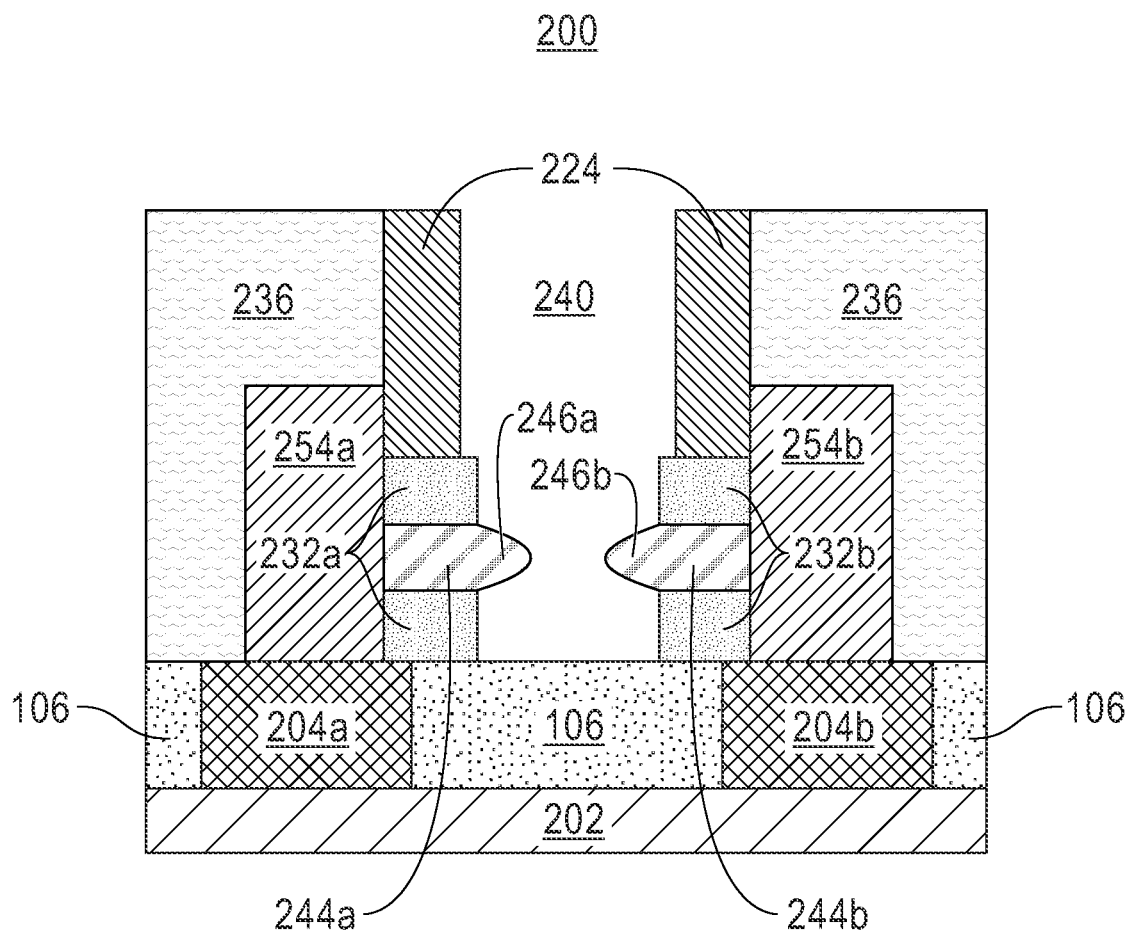
FIG. 17 depicts a top-down view of the RRAM cell of FIG. 15, with like reference numerals referring to like features and at a subsequent stage of the fabrication process.

FIG. 17 depicts a cross-sectional side view of the RRAM cell 200 of FIG. 15, with like reference numerals of previous figures referring to like features and at a subsequent stage of the fabrication process. The mandrel 222, and sacrificial layers 210, 214 of the stack 208, are removed from a region 240 between the spacers 224 and inner spacers 232*a*, 232*b*. Following the removal of the mandrel 222 and the sacrificial layers 210, 214, a wire layer 212 located within the stack 208 is etched to form nanowires 244*a*, 244*b* with sharpened points 246*a*, 246*b*, as described above.

Figure 18:
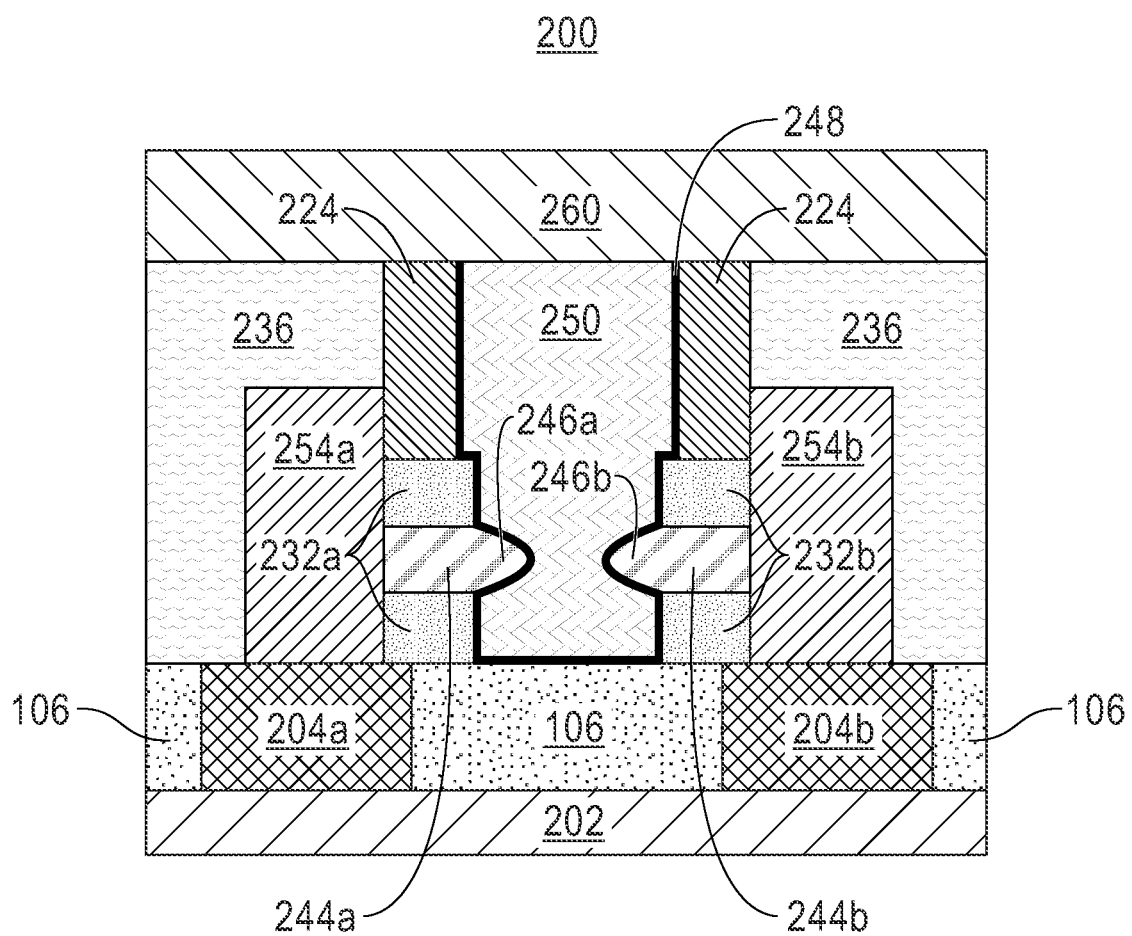
FIG. 18 depicts a cross-sectional side view of the RRAM cell of FIG. 15, with like reference numerals of previous figures referring to like features and at a subsequent stage of the fabrication process.

FIG. 18 depicts a cross-sectional side view of the RRAM cell 200 of FIG. 15, with like reference numerals of previous figures referring to like features and at a subsequent stage of the fabrication process. The RRAM cell 200 is finished with deposition of a high-κ dielectric layer 248 and a metal contact 250 that connect the sharpened points 246*a*, 246*b* with a bitline 260 for logical operations in conjunction with the wordlines 204*a*, 204*b*.

As illustrated in a difference between FIG. 17 and FIG. 18, one or more of the steps of forming the high-κ dielectric layer 248, the metal contact 250, and the bitline 260 may involve CMP, such that the height of the ILD 236 is shorter than when the nanowires 244*a*, 244*b* were formed.

The RRAM cell 200 with ILD 236 insulation between the sidewall metal contact 254 and the bitline 260 operates similarly to the RRAM cell 100 with the sidewall dielectric caps 156. That is, a set signal is sent to the first wordline 204*a* and the bitline 260, and the first nanowire 244*a* may be set, creating filaments in the high-κ dielectric layer 248. The filaments are confined to an area near the first sharpened point 246*a*. That is, the sharpened point 246*a* provides a ready path for the set signal to pass between the first wordline 204*a* and the bitline 260, and a filament is created. Additionally, the first sharpened point 246*a* also provides a ready path for the read signals after the filaments have been created. Similar operation is enabled for the second nanowire 244*b* for set and read signals between the bitline 260 and the second wordline 204*b*.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive random access memory (RRAM) cell, comprising:
 a first nanowire electrically connected to a first wordline electrode, wherein the nanowire comprises a first sharpened point distal from the first wordline electrode;
 a metal contact electrically connected to a bitline electrode; and
 a high-κ dielectric layer directly between the nanowire and the metal contact.

2. The RRAM cell of claim 1, comprising a second RRAM cell comprising:
 a second nanowire electrically connected to a second wordline electrode, wherein the second nanowire comprises a second sharpened point distal from the second wordline electrode;
 a second high-κ dielectric layer directly between the second nanowire and the metal contact.

3. The RRAM cell of claim 2, wherein the first sharpened point protrudes into a first side of the metal contact, and the second sharpened point protrudes into a second side of the metal contact opposite the first side.

4. The RRAM cell of claim 1, further comprising a sidewall metal contact above the first wordline electrode and electrically between the first wordline electrode and the first nanowire.

5. The RRAM cell of claim 4, comprising a sidewall dielectric cap between the sidewall metal contact and the bitline electrode.

6. The RRAM cell of claim 1, wherein the nanowire comprises titanium nitride and the high-κ dielectric layer comprises hafnium oxide.

7. A method of fabricating a resistive random access memory (RRAM) cell, comprising:
 forming a vertical fin segment comprising a wire layer between a first sacrificial layer and a second sacrificial layer;

recessing lateral ends of the first sacrificial layer and the second sacrificial layer to form recesses;

forming an inner spacer in the recesses of the first sacrificial layer and the second sacrificial layer;

removing the first sacrificial layer and the second sacrificial layer to expose the wire layer;

etching the wire layer to form a first nanowire comprising a first sharpened point and a second nanowire comprising a second sharpened point;

forming a high-κ dielectric layer over the first nanowire and the second nanowire; and forming a metal contact, wherein the high-κ dielectric layer is directly between the first nanowire and the metal contact, and directly between the second nanowire and the metal contact.

8. The method of claim 7, wherein the vertical fin segment is formed between a first wordline electrode and a second wordline electrode.

9. The method of claim 8, comprising forming a sidewall contact between the first wordline electrode and the first nanowire.

10. The method of claim 8, wherein the wordline electrode is formed over a device layer of a semiconductor structure.

11. The method of claim 7, wherein etching the wire layer comprises isotropic etch.

12. The method of claim 7, comprising forming a bitline that is electrically connected to the metal contact.

13. The method of claim 7, forming a mandrel, and spacers on opposing sides of the mandrel, over the vertical fin segment before recessing the lateral ends of the first sacrificial layer and the second sacrificial layer.

14. The method of claim 13, wherein recessing the first sacrificial layer and the second sacrificial layer comprises recessing under the spacers and at least partially under the mandrel.

15. A method of fabricating a resistive random access memory (RRAM) cell, comprising:

forming a wire stack comprising a wire layer supported on a first lateral end by a first inner spacer and supported on a second lateral end by a second inner spacer, wherein the wire layer is exposed in a region between the first inner spacer and the second inner spacer; and isotropically etching the wire layer in the region to form a first nanowire and a second nanowire, wherein the etching is non-reactive to the first inner spacer and the second inner spacer.

16. The method of claim 15, comprising forming a sidewall contact between a first wordline electrode and the first nanowire.

17. The method of claim 16, wherein the wordline electrode is formed over a device layer of a semiconductor structure.

18. The method of claim 15, further comprising:

forming a high-κ dielectric layer over the first nanowire and the second nanowire; and forming a metal contact, wherein the high-κ dielectric layer is directly between the first nanowire and the metal contact, and directly between the second nanowire and the metal contact.

19. The method of claim 18, comprising forming a bitline that is electrically connected to the metal contact.

20. The method of claim 15, further comprising forming a mandrel, and spacers on opposing sides of the mandrel, over the wire stack before recessing a lateral ends of sacrificial layers to form the first inner spacer and the second inner spacer.

* * * * *